United States Patent [19]

Droira et al.

[11] 4,401,234
[45] Aug. 30, 1983

[54] APPARATUS FOR APPLYING INTEGRATED CIRCUITS TO A CIRCUIT BOARD

[75] Inventors: Diego I. Droira, Chicago, Ill.; Richard J. Sikorski, Aurora, Colo.

[73] Assignee: Universal Research Laboratories, Incorporated, Elk Grove Village, Ill.

[21] Appl. No.: 269,424

[22] Filed: Jun. 1, 1981

[51] Int. Cl.³ ............................................. H05K 3/30
[52] U.S. Cl. .................................... 221/92; 221/103; 221/106; 221/279; 221/226; 29/741
[58] Field of Search ................. 221/92, 104, 103, 106, 221/287, 89, 226, 279; 29/741

[56] References Cited

U.S. PATENT DOCUMENTS

| | | | |
|---|---|---|---|
| 1,704,318 | 3/1929 | Gregory | 221/226 |
| 4,000,709 | 1/1977 | Mojden | 221/104 |
| 4,202,092 | 5/1980 | Shibasaki et al. | 29/741 |

*Primary Examiner*—Joseph J. Rolla
*Assistant Examiner*—Charles C. Compton
*Attorney, Agent, or Firm*—George H. Gerstman

[57] ABSTRACT

Automated apparatus for applying integrated circuits to a circuit board in which the integrated circuits are fed to the apparatus through the open end of a tubular magazine which holds them in a linear array, and which is positioned in registry with a feeding aperture of the apparatus. By this invention, a casing is provided for holding a plurality of the magazines in side-by-side relation, with the first of the magazines of the plurality occupying the position of registry with the feeding aperture. A spring loaded platen member is provided for biasing the magazines toward the position of the first magazine, so that when the first magazine is emptied of its integrated circuits it may be removed from the casing, and another of the tubular magazines moved by the resilient means into the position of registry.

5 Claims, 5 Drawing Figures

APPARATUS FOR APPLYING INTEGRATED CIRCUITS TO A CIRCUIT BOARD

BACKGROUND OF THE INVENTION

Electronic components are often made by attaching integrated circuits and equivalent small components to a circuit board for use in electronic games, computers, and a multitude of other uses. The electrical conductors between the integrated circuits on the board and the various other components may be printed onto the circuit board, with the various components being each applied to the board at a precisely determined location, to enter into electrical connection with the various printed conductor lines.

The manufacture of all electronic components, including circuit boards carrying integrated circuits and the like, is intensely price competitive, so there is a continuing need to improve the efficiencies of manufacturing operations.

Currently, many of the operations of manufacturers of electronic circuit boards are manually done, so improvements in automation are needed.

As one currently available automated technique, machines are available for the automated installation of integrated circuits onto circuit boards with the machine operating to precisely position a number of integrated circuits and similar devices in precisely predetermined positions on the board. The machines are capable of applying in an automated manner a large number of different types of integrated circuits to the same board, each positioned in a precisely predetermined position.

For example, the Multi-Module automatic DIP insertion machine is sold by Universal Instruments Corporation of Binghamton, New York. This machine is capable of applying any or all of 72 different types of integrated circuits or the like to a circuit board, each being precisely attached to the board in a predetermined manner at a high speed. Basically, the circuit board is placed on a horizontally movable table, and the various types of integrated circuits are placed in tubular magazines that extend vertically over feeding apertures in the machine. An installer assembly reciprocates back and forth along the line of magazines, selecting the integrated circuits for installation from each magazine in accordance with a computer program and delivering them in conjunction with the movable table, to precise positions on the circuit board.

While this commercially available machine provides great efficiencies of operation in the manufacture of electronic circuit boards, it has been found that, in operation, from 40 to 50 percent of the time during a regular operating shift the machine is not operating because one or another magazine has been exhausted of its supply of integrated circuits. This is so even if a skilled operator is constantly monitoring the supply of integrated circuits in the magazine, because the machine operates so rapidly that the operator falls behind in the continuing and demanding operation of (1) noting an exhausted magazine among the substantial array of magazines that may be replaced, (2) removing the exhausted magazine, (3) selecting another magazine containing that particular type of integrated circuit from among the large number of loaded magazines that must be available for the machine, and (4) reinstalling the filled magazine into its proper place on the machine, while also loading fresh and unloading processed circuit boards into and from the machine.

In accordance with this invention, a further efficiency of operation is provided to simplify the labor of the operator of the machine by the use of pre-loaded casings holding a plurality of tubular magazines, which can be automatically placed into operating relation with the automated apparatus, one after another, as individual magazines are exhausted. Thus the operator is spared the time-consuming burden of having to make an individual selection of magazines and an individual installation thereof when a particular magazine is exhausted. He has to only remove the exhausted magazine to permit another one to snap into position.

As a further efficiency, the individual casings may be loaded with magazines by less skilled help at a different location and time. They do not have to exercise the responsibility of selecting the proper type of magazine for loading, since typically each of the casings holds magazines which all contain only a single type of integrated circuit.

Thus a substantial increase in efficiency of automated apparatus for applying integrated circuits and similar devices to a circuit board can be obtained through the use of this invention.

DESCRIPTION OF THE INVENTION

By this invention, automated apparatus for applying integrated circuits and the like to a circuit board is provided in which the integrated circuits are fed to the apparatus through the open end of a tubular magazine which holds the integrated circuits in a linear array, positioned in registry with a feeding aperture of the apparatus.

In accordance with this invention, casing means are provided for holding a plurality of tubular magazines in side-by-side relation, with a first of the magazines of the plurality occupying a position of registry with a feeding aperture.

Means are provided for biasing the magazines toward the position of the first magazine. As the result of this, when the first magazine is emptied of integrated circuits through operation of the apparatus, it may be removed from the casing means, and another of the tubular magazines spontaneously moved by the biasing means into the position of registry so that the operation of the apparatus can continue. The biasing means may be a resilient pressure member such as a spring, or pneumatic cylinder, or it may be an electronic motor or the like.

Typically, the apparatus has a plurality of feeding apertures and a corresponding plurality of casing means associated with the feeding apertures. The plurality of tubular magazines in each, individual casing typically all contain only a single type of integrated circuit. Generally, differing casings on the machine at any given time carry different types of integrated circuits.

Each casing means may comprise a flattened, substantially tubular member proportioned to receive within the bore thereof the plurality of tubular magazines described above. One end of the tubular member typically carries an end wall, and a port is defined through that end wall which is proportioned to allow passage of integrated circuits from the first magazine to the feeding aperture. Attachment means are also provided to permit removable positioning of the casing means, to place the first magazine into registry with the feeding aperture for operation of the machine.

The attachment means may comprise a bayonet member carried by and extending from the casing means for removable locking of the casing means adjacent to the feeding aperture.

The resilient means within the casing means may comprise a spring-biased platen for pressing the plurality of magazines toward the position of registry. Sliding shaft members may also by provided for stabilizing the platen projecting outwardly through a wall of the tubular member.

Figure 1:
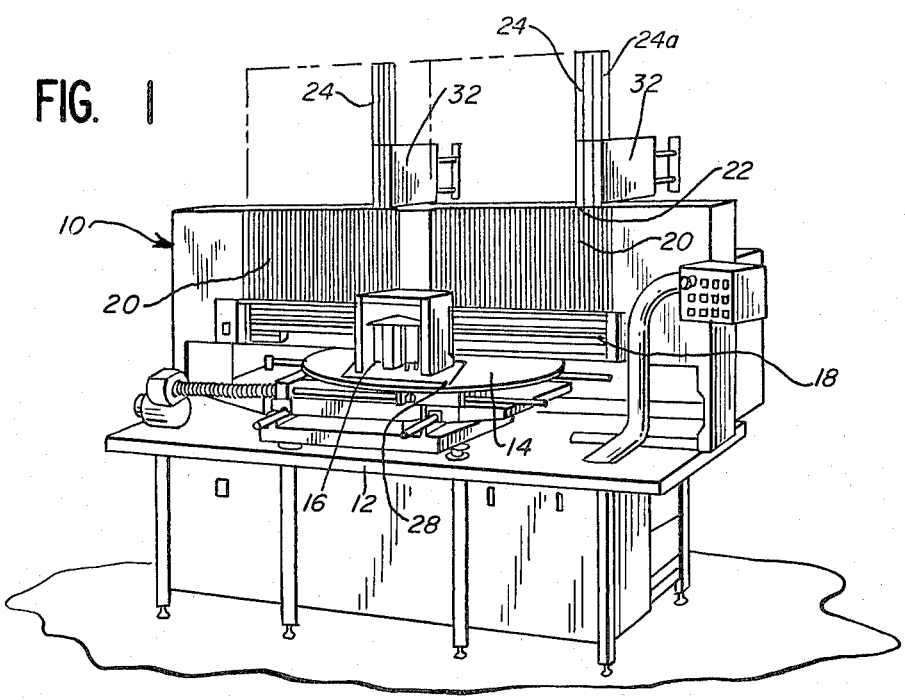
FIG. 1 is a perspective view of a machine for automatically inserting integrated circuits onto a circuit board, utilizing this invention.

Referring to the drawings, automated apparatus 10 for applying integrated circuits or similar structures to a circuit board is disclosed. The specific apparatus utilized may be the previously described automatic DIP insertion machine sold by The Universal Instruments Corporation, modified as described herein.

Apparatus 10 defines a support structure 12 and a horizontally movable table 14 upon which the circuit board may be placed. Installation apparatus 16 is capable of sliding back and forth along slide member 18 into registry with any of the feeding aperture tubes 20 which communicate at their upper end with feeding apertures 22. These, in turn, receive integrated circuits from a first magazine 24, which may be a vertically upstanding tubular structure of typically noncircular cross section holding a stack of integrated circuits 26 of a particular type. Magazines 24 may comprise an extruded tubular plastic member and have a bore portion 27 of roughly the configuration of the integrated circuits in a manner which is conventional. The integrated circuits fall through feeding aperture tube 20, to be received by installer unit 16 which has reciprocated along track 18 into proper position, being guided by a computer program. Then installer member 16 moves over table 14 which moves, in turn, to a predetermined horizontal position, and the integrated circuit carried by installer unit 16 is affixed to circuit board 28.

Figure 2:
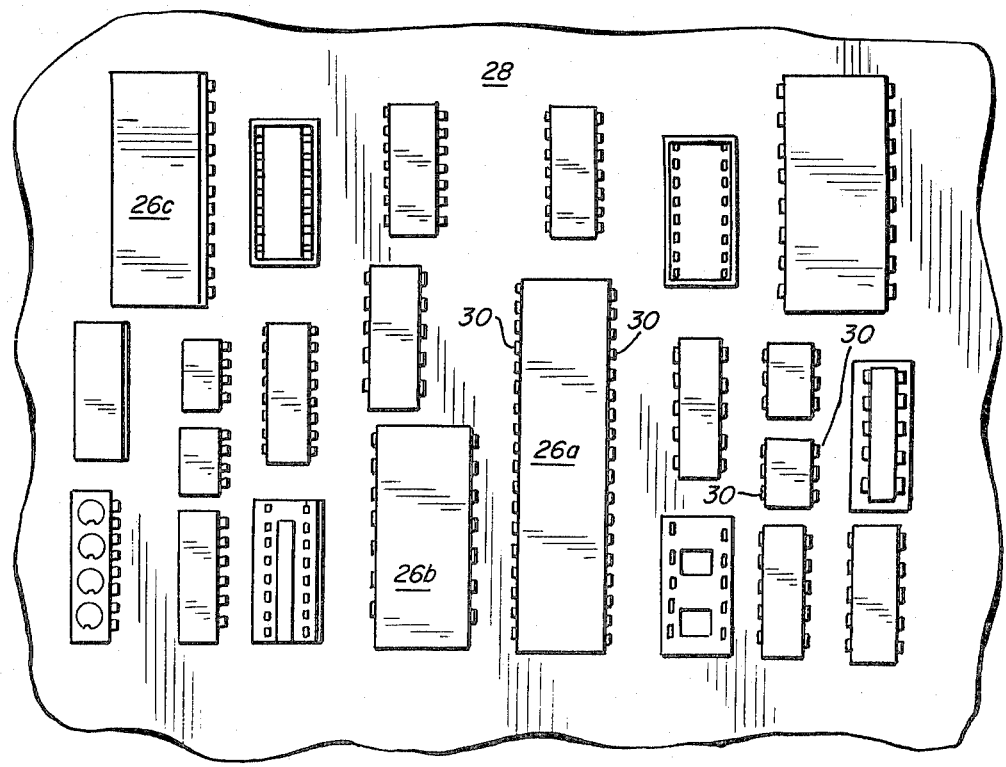
FIG. 2 is a plan view of a portion of a circuit board carrying a number of differing integrated circuits, all of which may be installed by the apparatus of FIG. 1.

For example, as shown in FIG. 2, a large variety of integrated circuits 26a, 26b, 26c, etc., of different types, may be precisely positioned on board 28 by installer unit 16, which goes to the specific feeding aperture tube 20 carrying the specific desired type of integrated circuit, collects it, and moves back to the installing location, while at the same time horizontally movable table 14 positions circuit board 28 to the desired position, followed by installation of the particular integrated circuit.

Typically, circuit board 28 may be perforated with an array of small holes (not shown) so that the leads 30, which typically project in a direction normal to the overall plane of each integrated circuit 26, may pass through the holes and be bent around the back of board 28 in a conventional manner. As shown, the number of leads 30 on each integrated circuit can vary widely, as can the size, shape and function of each integrated circuit 26.

Figure 3:
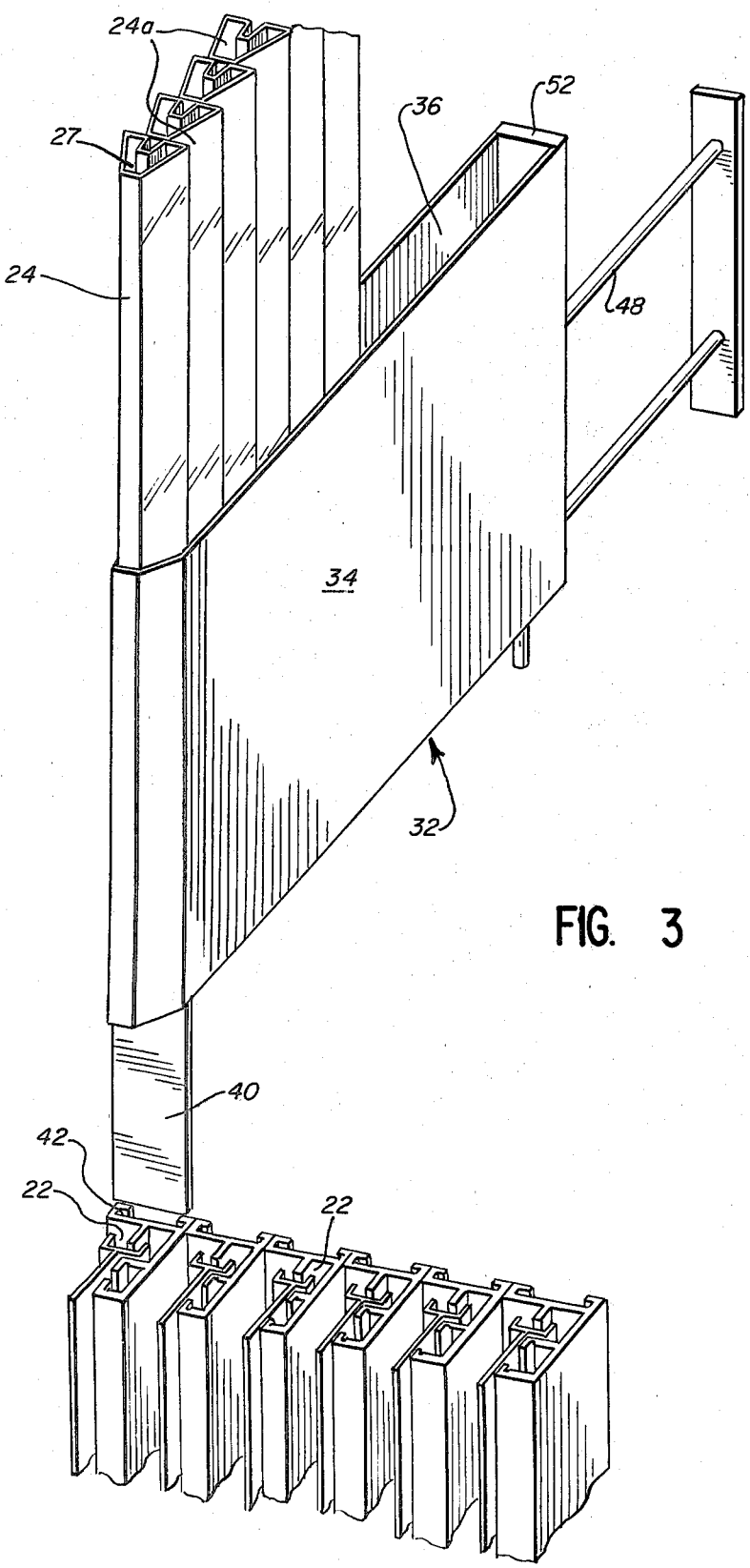
FIG. 3 is a fragmentary, enlarged perspective view of the apparatus of this invention about to be inserted into registry with a feeding aperture of the apparatus of FIG. 1.
Figure 4:
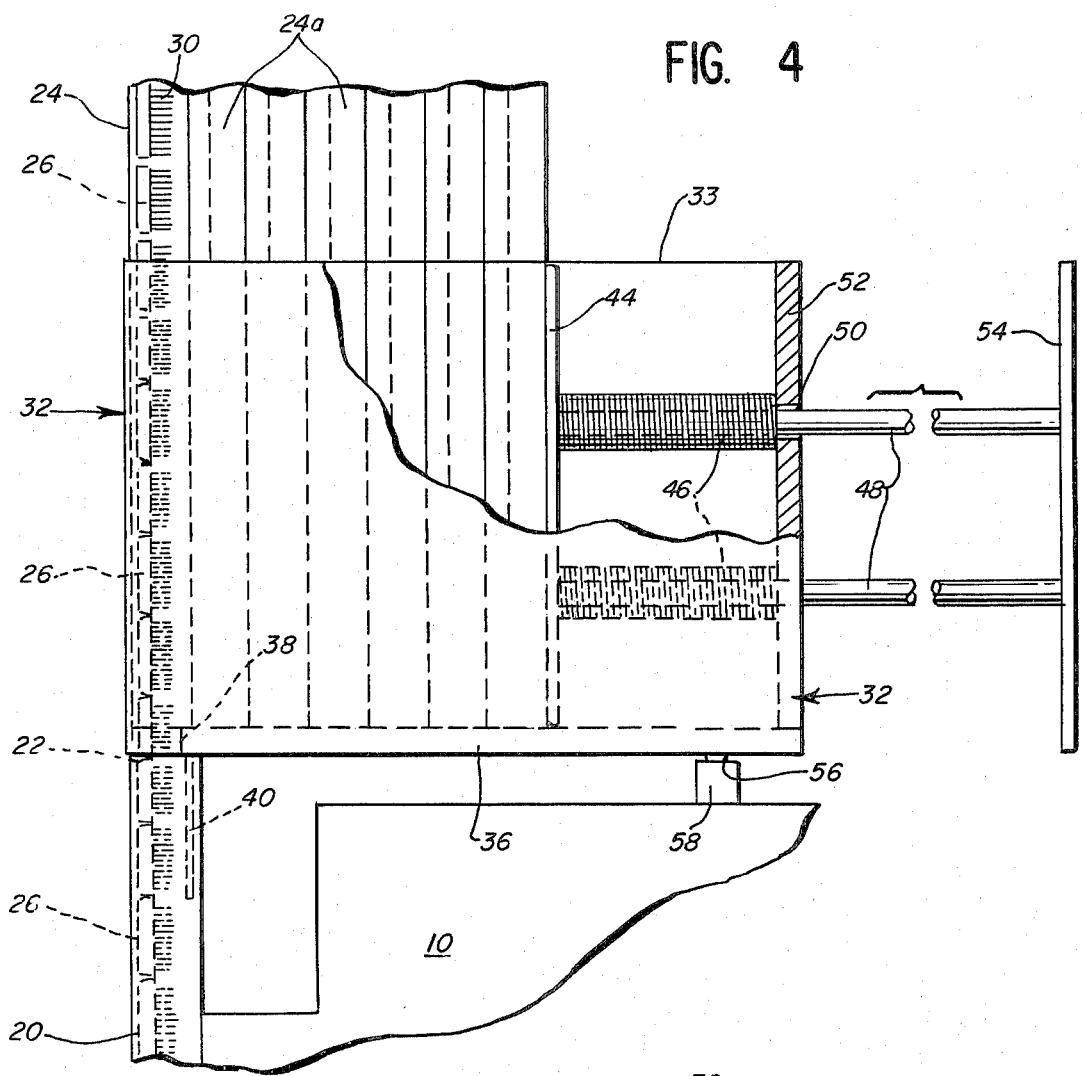
FIG. 4 is a fragmentary elevational view, with internal portions shown in phantom, of the portion of the apparatus of FIG. 1, showing details of the invention.

In accordance with this invention, magazines 24 utilized herein are carried in one or more casings 32, with several magazines 24, 24a being held together in a casing 32 in side-by-side relation, as shown for example in FIGS. 3 and 4.

As shown, casing 32 may comprise a flattened, substantially tubular member 34 which is proportioned to receive within its bore 35 the plurality of tubular magazines 24, 24a, and having open end 33.

Figure 5:
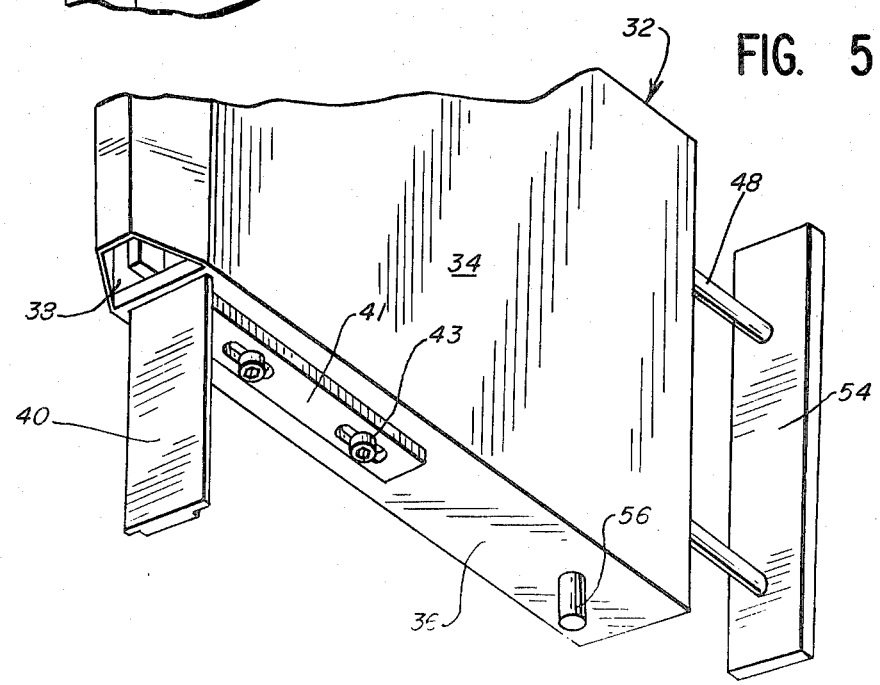
FIG. 5 is a bottom perspective view of the casing means of this invention.

The other end of tubular member 34 may carry end wall 36 as shown in FIGS. 4 and 5. The same end defines a port 38, which is proportioned to allow passage of integrated circuits 26 from first magazine 24 in its position of registry with feeding aperture 22. Thus the integrated circuits 26 can fall from magazine 24 in the position of registry through port 38 and feeding aperture 22, through aperture tube 20, for collection by installer unit 16 in a manner known to the art.

An attachment bayonet 40 is carried by casing 32, and fits into slot 42 (FIG. 3) for removable carrying of casing 32 adjacent to and in registry with the feeding aperture.

Bayonet 40 may be carried by angled plate 41 which, in turn, may be carried on end wall 36 in adjustable manner by set screws 43, so that the position of bayonet 40 may be adjusted. Thus the registry of aperture 38 with feeding aperture 22 may be adjusted where necessary by the adjustment of plate 41 and set screws 43.

As shown in FIG. 3, the various feeding apertures 22 of the apparatus of FIG. 1 are positioned in side-by-side relation, with casings 32 being proportioned so that each of the feeding apertures 22 may carry a casing 32 when that is desired. In the alternative, only a minority of the feeding apertures 22 may be in use at any one time.

The resilient means described above for biasing magazines 24a toward the position of magazine 24 may include a platen 44 which is biased by springs 46 to press the plurality of magazines 24a toward the position of registry occupied by magazine 24.

Sliding shaft members 48 projecting through springs 46 and outwardly through apertures 50 in side wall 52 may be provided for carrying and stabilizing the platen, which accordingly is capable of traveling back and forth within the interior of casing 32, to exert its biasing action against magazines 24a.

Second platen 54, carried on shaft members 48, may serve as a handle to pull sliding shaft members 48 and to compress springs 46 for installation of magazines 24, 24a. Pin 56 can fit in socket 58 on apparatus 10 (FIG. 4) for stabilizing the rear of casing 32.

Accordingly, the apparatus shown herein operates in its conventional manner to take integrated circuits 26 from the various feeding aperture tubes 20, for installation at a predetermined location on board 28. However, by this invention, when a magazine 24 becomes empty of integrated circuits, which is a frequent occurrence, the operator has to only remove the empty magazine 24 out of the top of casing 32. The empty magazine is promptly and spontaneously replaced with the next adjacent magazine 24a, impelled by springs 46, so that the integrated circuits in that new magazine are free to drop through aperture 38 into the tube 20 with which it registers.

Thus the apparatus can operate on a substantially continuous basis, since the operator is freed of the necessity to select a new magazine containing integrated circuits of the proper type every time a magazine is exhausted, but instead he has to only remove the magazines as they become exhausted, one by one, without the need for exercising that frequent selection operation of replacing individual magazines. The operator thus has more time to install and replace circuit boards as they are processed, with the result that the apparatus of this invention can operate on substantially a full time basis, rather than being "down" for considerable periods of time while the operator is searching for and selecting a new magazine of the proper type.

Casings 32 may hold any number of magazines as may be desired, for example 20 or more, so that each casing may for example have to be replaced only one-twentieth as often as the individual magazines of the prior art.

As the result of this, great efficiencies in the speed of operation and productivity of automated apparatus for applying integrated circuits and similar items to a circuit board are provided.

The invention as described herein may also be used for the application of other items to a board member or similar structure for use in other areas of technology as may be desired, above and beyond the specifically described use in manufacture of circuit boards which carry integrated circuits.

The above has been offered for illustrative purposes only, and is not intended to limit the scope of the invention of this application, which is as defined in the claims below.

That which is claimed is:

1. An automated apparatus for applying integrated circuits to a circuit board in which integrated circuits and the like are fed to the apparatus through the open end of a tubular magazine which holds said integrated circuits in a linear array positioned in registry with a feeding aperture of said apparatus, the improvement comprising, in combination:
    casing means for holding a plurality of said tubular magazines in side-by-side relation, with a first of the magazines of said plurality occupying a position of registry with said feeding aperture, and meanns for biasing said magazines toward the position of said first magazine, whereby when the first magazine is emptied of integrated circuits, it may be removed from the casing means and another of said tubular magazines moved into the position of registry;
    said casing means comprises a flattened, substantially tubular member proportioned to receive within the bore thereof said plurality of tubular magazines, one end of said tubular member carrying an end wall, a port in said one end proportioned to allow passage of integrated circuits from the first magazine to the feeding aperture, and attachment means to permit removable positioning of said casing means to place the first magazine into registry with the feeding aperture;
    said attachment means comprising a bayonet member carried by and extending from said casing means for removable positioning adjacent said feeding aperture.

2. An automated apparatus for applying integrated circuits to a circuit board in which integrated circuits and the like are fed to the apparatus through the open end of a tubular magazine which holds said integrated circuits in a linear array positioned in registry with a feeding aperture of said apparatus, the improvement comprising, in combination:
    casing means for holding a plurality of said tubular magazines in side-by-side relation, with a first of the magazines of said plurality occupying a position of registry with said feeding aperture, and means for biasing said magazines toward the position of said first magazine, whereby when the first magazine is emptied of integrated circuits, it may be removed from the casing means and another of said tubular magazines moved into the position of registry;
    said biasing means comprising a spring-biased platen for pressing said plurality of magazines toward the position of registry, and sliding shaft members for stabilizing said platen projecting outwardly through a wall of said tubular member.

3. An automated apparatus for applying integrated circuits and the like to a circuit board in which the integrated circuits are fed to the apparatus through the open end of a tubular magazine which holds the integrated circuits in a linear array positioned in registry with a feeding aperture of the apparatus, a plurality of said feeding apertures being present, the improvement comprising, in combination:
    a corresponding plurality of casing means associated with the feeding apertures, a plurality of tubular magazines positioned in each individual casing means, said plurality of magazines being positioned in side-by-side relation, with the first of the magazines of said plurality occupying a position of registry with said feeding aperture, and means for biasing said magazines toward the position of said first magazine, whereby, when the first magazine is emptied of integrated circuits, it may be removed from the casing means and another of said tubular magazines moved into the position of registry;
    each individual casing means containing only a single type of integrated circuit, and different casing means carrying different types of integrated circuits;
    each casing means comprising a flattened, substantially tubular member proportioned to receive within the bore thereof said plurality of tubular magazines, one end of said tubular member carrying an end wall, a port in said one end proportioned to allow passage of integrated circuits from the first magazine to the feeding aperture, and attachment means to permit removable positioning of each casing means to place the first magazine into registry with a feeding aperture;
    said attachment means comprising a bayonet member extending from the casing means for removable positioning adjacent said feeding aperture.

4. The apparatus of claim 3 in which said biasing means comprises a spring-biased platen within said casing means for pressing the plurality of magazines toward the position of registry, and sliding shaft members for stabilizing said platen projecting outwardly through a wall of said tubular member.

5. The apparatus of claim 4 in which a second platen is carried on the outer ends of said shaft members.

* * * * *